United States Patent
Navet et al.

(10) Patent No.: US 10,703,674 B2
(45) Date of Patent: Jul. 7, 2020

(54) ION IMPLANTATION PROCESS AND ION IMPLANTED GLASS SUBSTRATES

(71) Applicants: AGC GLASS EUROPE, Louvain-la-Neuve (BE); AGC Inc., Chiyoda Ku (JP); QUERTECH INGENIERIE, Caen (FR)

(72) Inventors: Benjamine Navet, Louvain-la-Neuve (BE); Pierre Boulanger, Couthuin (BE); Lionel Ventelon, Nivelles (BE); Denis Busardo, Gonneville sur Mer (FR); Frederic Guernalec, Liffre (FR)

(73) Assignees: AGC GLASS EUROPE, Louvain-la-Neuve (BE); AGC Inc., Chiyoda-Ku (JP); QUERTECH INGENIERIE, Caen (FR)

( * ) Notice: Subject to any disclaimer, the term of this patent is extended or adjusted under 35 U.S.C. 154(b) by 0 days.

(21) Appl. No.: 15/520,908

(22) PCT Filed: Oct. 21, 2015

(86) PCT No.: PCT/EP2015/074400
§ 371 (c)(1),
(2) Date: Apr. 21, 2017

(87) PCT Pub. No.: WO2016/062779
PCT Pub. Date: Apr. 28, 2016

(65) Prior Publication Data
US 2017/0334775 A1   Nov. 23, 2017

(30) Foreign Application Priority Data
Oct. 24, 2014   (EP) .................................... 14190324

(51) Int. Cl.
*C23C 14/48* (2006.01)
*C03C 23/00* (2006.01)
(52) U.S. Cl.
CPC .......... *C03C 23/0055* (2013.01); *C23C 14/48* (2013.01)

(58) Field of Classification Search
CPC ..................................................... C23C 14/48
See application file for complete search history.

(56) References Cited

U.S. PATENT DOCUMENTS

| 5,066,514 A * | 11/1991 | Oyoshi ............... C03C 23/0055 |
| | | 250/492.2 |
| 2012/0194974 A1* | 8/2012 | Weber ................... C03C 21/002 |
| | | 361/679.01 |
| 2013/0149459 A1 | 6/2013 | Bruna et al. |
| 2014/0248472 A1* | 9/2014 | Memering .............. C23C 14/48 |
| | | 428/192 |
| 2015/0376058 A1 | 12/2015 | Busardo et al. |

FOREIGN PATENT DOCUMENTS

| WO | 2014/125211 A2 | 8/2014 |
| WO | 2014/155008 A1 | 10/2014 |

OTHER PUBLICATIONS

International Search Report dated Feb. 18, 2016 in PCT/EP2015/074400 filed Oct. 21, 2015.

* cited by examiner

*Primary Examiner* — Dah-Wei D. Yuan
*Assistant Examiner* — Kristen A Dagenais-Englehart
(74) *Attorney, Agent, or Firm* — Oblon, McClelland, Maier & Neustadt, L.L.P.

(57) ABSTRACT

The invention concerns a process for increasing the scratch resistance of a glass substrate by implantation of simple charge and multicharge ions, comprising maintaining the temperature of the area of the glass substrate being treated at a temperature that is less than or equal to the glass transition temperature of the glass substrate, selecting the ions to be implanted among the ions of Ar, He, and N, setting the acceleration voltage for the extraction of the ions at a value comprised between 5 kV and 200 kV and setting the ion dosage at a value comprised between $10^{14}$ ions/cm$^2$ and $2.5 \times 10^{17}$ ions/cm$^2$. The invention further concerns glass substrates comprising an area treated by implantation of simple charge and multicharge ions according to this process and their use for reducing the probability of scratching on the glass substrate upon mechanical contact.

6 Claims, No Drawings

ION IMPLANTATION PROCESS AND ION IMPLANTED GLASS SUBSTRATES

FIELD OF THE INVENTION

The present invention is related to glass substrates and their manufacture, in particular to glass substrates that are exposed to mechanical contact and the treatment by ion implantation thereof. Glass substrates according to the present invention may have different uses. They may be used in architectural glazing, automotive glazing, furniture, white goods, shower partitions, screens, displays, structural glazing, barcode scanners, and watches.

PRIOR ART

It is well known that glass is sensitive to scratches. Scratches reduce the mechanical durability of the glass, degrade the glasses esthetical value and reduce visibility through the glass. This is especially the case in any application where glass is exposed to frequent mechanical contact. This is for example the case for glass that is used in furniture or floors but also for glass that is used in any kind of displays. More largely even any glass that is subjected to cleaning may be scratched by particle contamination on the glass surface as well as by the use of abrasive cleaning equipment. There are several possibilities for increasing the mechanical durability of glass.

Thermal and chemical tempering for example are commonly used to increase the mechanical strength of glass substrates. However once toughened in this way, the glass substrates cannot be sawn, cut, drilled or processed. Furthermore it has been reported that scratches on tempered glass are more visible because of chipping of the glass along the scratch. So although tempering increases the mechanical strength with regard to breakage it does not reduce the appearance of scratches.

Certain hard coating materials are available that reduce the scratch sensitivity of glass surfaces. One such coating material is diamond-like carbon (DLC). Coating glass with DLC coatings however requires an expensive vacuum deposition equipment and leads to reduced transmittance. Another such coating material is tin oxide. Tin oxide is usually deposited by chemical vapor deposition (CVD). CVD of tin oxide is usually conducted at high temperatures, often directly on the float glass production line. It requires the use of expensive chemicals and the resulting coatings strongly modify the optical properties of the glass substrate.

It is also known that the mechanical properties of glasses can be modified by ion implantation. In particular these implantation processes rely on the implantation of ions such as ions of H, He, Ne, Ar, N, O, F that have a single positive charge.

WO2005/080285A1 for example discloses the implantation of H and He ions in glass for strengthening purposes. Using ion energies of several hundred keV and dosages of $10^{13}$ to $10^{15}$ ions/cm$^2$, implantation depths of more than 5000 nm are obtained. However this process tends to generate such a high stress in the vicinity of the surface that the glass becomes curved.

Furthermore the equipment necessary for the production of ions at such high ion energy is very expensive. Given that the ions implanted this way have a single positive charge, the depth distribution of ions implanted in the glass is limited to a narrow range, giving a narrow depth distribution profile. It is known that when the amount of ions implanted becomes very high in a limited area there is a risk of degrading the glass substrate, for example due to increased stress in the glass. This risk is higher when the depth distribution of ions in the glass is narrow as for a given ion dosage the local concentration is higher. Therefore the amount of ions that may be implanted by this technology in to a certain area of is quite limited.

SUMMARY OF THE INVENTION

An object of this invention is to provide a method for implanting ions in a glass substrate in order to improve the scratch resistance. With increasing scratch resistance the probability of scratching upon mechanical contact is reduced. A particular the object of this invention is to provide a method for implanting ions in a glass substrate that allows the implantation of a high dose of ions while avoiding a narrow depth distribution profile.

Another object of this invention is a ion implanted glass substrate with increased scratch resistance.

Another object of this invention is the use of an ion implanted glass substrate in architectural glazing, automotive glazing, furniture, white goods, shower partitions, screens, displays, structural glazing, barcode scanners, and watches for reducing the probability of scratching of these glass substrates upon mechanical contact.

The glass substrate according to this invention may be a glass sheet of any thickness having the following composition ranges expressed as weight percentage of the total weight of the glass.

| | |
|---|---|
| SiO2 | 55-85% |
| Al2O3 | 0-30% |
| B2O3 | 0-20% |
| Na2O | 0-25% |
| CaO | 0-20% |
| MgO | 0-15% |
| K2O | 0-20% |
| BaO | 0-20% |
| Iron total (expressed as Fe2O3) | 0.002-0.1%. |

The glass substrate according to this invention is preferably a glass sheet chosen among a soda-lime glass sheet or an aluminosilicate glass sheet.

According to an embodiment of the present invention the glass substrate is a textured glass, an acid-etched glass or a sand-blasted glass.

According to an embodiment of the invention the glass substrate is a chemically tempered glass or heat treated glass.

The invention proposes a method for treating a glass substrate by subjecting an area of the glass substrate to an ion beam so as to implant ions of the beam up to a certain depth into the glass substrate, creating a three dimensional implantation zone, wherein 1. the positively charged ions are generated by an ion source which produces simultaneously single charge and multicharge ions (ions carrying more than one positive charge). One such ion source is for example an Electron Cyclotron Resonance (RCE) ion source,
2. the ions of the beam are selected from the ions of Ar, N and He. The single charge and multicharge ions generated simultaneously by the ion source make up the ions of the beam,
3. the ion acceleration voltage is set at a value comprised between 5 and 200 kV,
4. the beam power is set at a value comprised between 1 W and 500 W, and 5. the ion dosage per surface unit is set at a value comprised between $10^{12}$ ions/cm$^2$ and $10^{18}$ ions/cm$^2$, preferably between $10^{14}$ ions/cm$^2$ and $2.5\times10^{17}$ ions/cm$^2$ In one embodiment of the invention the ion beam comprises $Ar^+$, $Ar^{2+}$, $Ar^{3+}$, $Ar^{4+}$, and $Ar^{5+}$. While the present invention may use an ion beam comprising varying amounts of the different Ar ions, example intensities of the respective Ar ions are shown in the Table 1 below.

TABLE 1

|  | Example intensity |
|---|---|
| $Ar^+$ | 2 mA |
| $Ar^{2+}$ | 1.29 mA |
| $Ar^{3+}$ | 0.6 mA |
| $Ar^{4+}$ | 0.22 mA |
| $Ar^{5+}$ | 0.11 mA |

The Ar ions are extracted with an acceleration voltage comprised between 5 kV and 200 kV, preferably comprised between 10 kV and 100 kV, more preferably between 20 kV and 60 kV, more preferably between 20 and 35 kV, most preferably at about 35 kV.

The ion dosage for Ar ions is comprised between $10^{12}$ ions/cm$^2$ and $10^{18}$ ions/cm$^2$, preferably between $10^{16}$ ions/cm$^2$ and $10^{18}$ ions/cm$^2$, preferably $5\times10^{16}$ ions/cm$^2$ and $5\times10^{17}$ ions/cm$^2$, most preferably between $7.5\times10^{16}$ ions/cm$^2$ and $2.5\times10^{17}$ ions/cm$^2$.

In another embodiment of the invention the ion beam comprises $N^+$, $N^{2+}$, and $N^{3+}$. While the present invention may use an ion beam comprising various amounts of the different N ions, example intensities of the respective N ions are shown in Table 2 below.

TABLE 2

|  | Example |
|---|---|
| $N^+$ | 0.55 mA |
| $N^{2+}$ | 0.60 mA |
| $N^{3+}$ | 0.24 mA |

The N ions are extracted with an acceleration voltage comprised between 10 kV and 100 kV, preferably comprised between 15 kV and 60 kV, more preferably comprised between 25 kV and 60 kV, more preferably between 25 kV and 35 kV most preferably at about 35 kV.

The ion dosage for N ions is comprised between $10^{12}$ ions/cm$^2$ and $10^{17}$ ions/cm$^2$, preferably between $10^{14}$ ions/cm$^2$ and $10^{17}$ ions/cm$^2$, more preferably between $5\times10^{14}$ ions/cm$^2$ and $10^{17}$ ions/cm$^2$, more preferably between $2.5\times10^{15}$ ions/cm$^2$ and $10^{17}$ ions/cm$^2$, most preferably between $2.5\times10^{15}$ ions/cm$^2$ and $5\times10^{16}$ ions/cm$^2$.

N ions are implanted up to a depth comprised between 0.1 μm and 0.5 μm in the substrate.

In another embodiment of the invention the ion beam comprises $He^+$, and $He^{2+}$. While the present invention may use an ion beam comprising various amounts of the different He ions, example intensities of the respective He ions are shown in Table 3 below.

TABLE 3

|  | Example |
|---|---|
| $He^+$ | 1.35 mA |
| $He^{2+}$ | 0.15 mA |

The He ions are extracted with an acceleration voltage comprised between 5 kV and 1000 kV, preferably comprised between 5 kV and 200 kV, more preferably comprised between 10 kV and 100 kV, most preferably between 20 and 60 kV.

The ion dosage for He ions is comprised between $10^{12}$ ions/cm$^2$ and $10^{18}$ ions/cm$^2$. Preferably the ion dosage for He ions is at least $10^{15}$ ions/cm$^2$ and lower than $10^{17}$ ions/cm$^2$, most preferably comprised between $10^{15}$ ions/cm$^2$ and $5\times10^{16}$ ions/cm$^2$.

The accelerator voltage and beam power as well as the dose of ions per unit of surface area are chosen to allow the implantation of ions from the beam into an implantation zone having a thickness D of between 0.1 μm and 1 μm, preferably between 0.1 μm and 0.5 μm.

For a fixed acceleration voltage, every differently charged ion will have a different energy. For example in an ion beam comprising $Ar^+$, $Ar^{2+}$, $Ar^{3+}$, $Ar^{4+}$, and $Ar^{5+}$ and an acceleration voltage of 35 kV, $Ar^+$, $Ar^{2+}$, $Ar^{3+}$, $Ar^{4+}$, and $Ar^{5+}$ ions will have an energy respectively of 35 keV, 70 keV, 105 keV, 140 keV, and 175 keV (kilo-electron-volt). The maximum implantation depth will increase from the least energetic ion ($Ar^+$) to the most energetic ion ($Ar^{5+}$).

Because of their higher energy ions carrying a higher charge will be implanted deeper into a substrate than ions carrying a lower charge. Therefore, for a given total ion dosage, a narrow depth distribution is obtained when only simple charge ions are implanted and a wider depth distribution is obtained when simple charge and multicharge ions are implanted simultaneously.

In a preferred embodiment of the present invention the temperature of the area of the glass substrate being treated, situated under the area being treated is less than or equal to the glass transition temperature of the glass substrate. This temperature is for example influenced by the intensities of the ions in the beam, by the residence time of the treated area in the beam and by any cooling means of the substrate.

In one embodiment of the invention glass substrate and ion beam are displaced relative to each other so as to progressively treat the glass substrate. Preferably they are displaced relative to each other at a speed $V_D$ comprised between 0.1 mm/s and 1000 m/s. $V_D$ is chosen in an appropriate way to control the residence time of the sample in the beam which influences ion dosage and temperature of the area being treated.

In one embodiment the glass substrate is at least treated on part of one or both of its surfaces.

In one embodiment the glass substrate is at least treated on the entirety one or both of its surfaces.

In one embodiment of the invention several ion beams are used simultaneously or consecutively to treat the glass substrate.

In one embodiment of the invention the total dosage of ions per surface unit of an area of the glass substrate is obtained by a single treatment by the ion beam.

In another embodiment of the invention the total dosage of ions per surface unit of an area of the glass substrate is obtained by a several consecutive treatments by the ion beam.

It is thus possible to enhance the scratch resistance properties of the surface of a glass substrate by introducing a certain dosage of the selected ions to a significant depth in the glass substrate.

It is also possible to obtain varying scratch resistance properties of the surface of a glass substrate by introducing various dosages of selected ions into different implantation zones on the glass substrate.

An object of this invention is to provide a process to increase the scratch resistance of glass by the implantation of simple charge and multicharge ions.

It is therefore possible to choose these conditions based on the desired scratch resistance.

The glass substrate according to the present invention may undergo further treatments and modifications, such as cutting and edge grinding, chemical tempering, thermal tempering or treatments to change the hydrophilicity or hydrophobicity of the surface.

DETAILED DESCRIPTION OF PARTICULAR EMBODIMENTS

The ion implantation examples were prepared according to the various parameters detailed in the tables below using an RCE ion source for generating a beam of single charge and multicharge ions.

All samples had a size of 10×10 $cm^2$ and a thickness of 4 mm and were treated on the entire surface by displacing the glass substrate through the ion beam at a speed of 80 mm/s.

The temperature of the area of the glass substrate being treated was kept at a temperature less than or equal to the glass transition temperature of the glass substrate.

For all examples the implantation was performed in a vacuum chamber at a pressure of $10^{-5}$ mbar.

Scratch resistance of the glass substrates was determined by a progressive load scratch test. This test corresponds to a load ramp applied during a defined displacement of the sample beneath it. Here measurements were performed with a microscratch tester "MicroCombi tester" from CSM Instruments. The scratch test consists in moving a diamond stylus that is placed on the substrate surface along a specified line under a linearly increasing normal force and with a constant speed. For glass samples of soda-lime type the scratches were made with a Rockwell diamond indenter with a tip radius of 200 μm (200 μm tip) as well as with a Rockwell diamond indenter with a tip radius of 100 μm (100 μm tip). For glass samples of aluminosilicate type the scratches were made with a Rockwell diamond indenter with a tip radius of 100 μm (100 μm tip).

The stylus was moved along a straight line of 1.5 cm in length. The speed was kept constant at 5 mm/min. The normal force (load) applied on the stylus was increased from 0.03 N at the start of the scratch to 30 N at the end of the scratch. During the scratch, the penetration depth, the acoustic emission and the tangential force are recorded and the aspect of the scratch is observed as a function of the penetration depth.

The load applied on the stylus when the first cracks appear at the glass surface is the critical load with 100 μm tip or the critical load with 200 μm tip depending on the radius of the Rockwell diamond indenter used. The scratch test performed with the 100 μm tip is more severe than the scratch test performed with the 200 μm tip. The scratch resistance with a certain tip of a sample is proportional to the critical load obtained with this tip is the scratch test.

For each sample the average of at least three measurements is determined. The higher the scratch resistance the higher the load at which the first cracks appear. The appearance of cracks along the scratch make the scratch more easily detectable by the naked eye. On identical samples cracks will appear with a smaller load on the 100 μm tip and with a larger load on the 200 μm tip.

On the equipment used for the present experiments the maximum possible load was limited to 30 N.

On some samples with a very high scratch resistance no cracks appear even when the maximum load is applied to the stylus having a 200 μm tip.

In the implantation zone of a glass substrate, the depth distribution profile of nitrogen in the glass was determined by secondary ion mass spectroscopy (SIMS). The SIMS depth distribution profiles were carried out on a Cameca imsf-4 instrument. The sputter erosion conditions are: primary beam 5.5 KeV Cs+, current density 0.16 mA/$cm^2$; sputtered area 125×125 $\mu m^2$. The analyzed area has a diameter of 60 μm. MCs+ ions are detected, where M stands for the element to be detected. The detection intensity signal I(M) for each element M versus the sputtering time is recorded at predetermined time intervals, leading to an intensity profile for this element versus a time scale. The depth scale is obtained by measuring the total depth of the crater obtained after the sputter erosion using a step profiler after the SIMS measurement. The time scale is converted into a depth scale assuming a constant sputtering rate.

For each sample (treated and non-treated as reference) the integral of the depth distribution (μm) of the intensity I(CsM) of the MCs$^+$ ions, normalized with respect to isotope ratio and Cs-intensity is calculated. In this case M stands for the elements N and Si. A semi-quantification of the Nitrogen quantities implanted is obtained by calculating the difference Δ between the values of I(CsN)/I(CsSi) integrated over the implantation depth of the treated glasses and the value of I(CsN)/I(CsSi) of the untreated reference glass. The implantation depth D of a treated sample is the depth at which the value for I(CsN)/I(CsSi) drops to the level of I(CsN)/I(CsSi) of the untreated reference glass.

For the purpose of the present invention the intensity ratio I(CsN)/I(CsSi) is calculated from the intensity signal I(CsN) of NCs+ for nitrogen and from the intensity signal I(CsSi) of SiCs+ for silicon, where the nitrogen isotope detected is $^{14}N$ and the silicon isotope detected is $^{28}Si$.

A semi-quantification of the N ion concentration in the implantation zone is obtained by calculating the ratio Δ/D.

No suitable method for determining the distribution profile of implanted Ar or He in glass could be found.

Table 4 shows the reference example R1 which is untreated soda-lime glass and soda-lime glass substrates treated with an argon ion beam. Untreated soda-lime glass has a critical load with 200 μm tip of 12.5 N.

Examples 1 to 3 show that with increasing Ion dosage of implanted single charge and multicharge argon ions the critical load is increased. Therefore the scratch resistance of soda-lime glass increases with the implantation of argon ions.

TABLE 4

| example | Glass type | Implanted ion | Ion acceleration voltage (kV) | Ion Dosage (ions/$cm^2$) | Critical load with 200 μm tip (N) |
|---|---|---|---|---|---|
| R1 | Soda-lime | — | — | — | 12.5 |
| 1 | Soda-lime | Argon | 35 | 7.5 × $10^{16}$ | 19.0 |
| 2 | Soda-lime | Argon | 35 | $10^{17}$ | 16.4 |
| 3 | Soda-lime | Argon | 35 | 2.5 × $10^{17}$ | 19.2 |

Table 5 shows soda-lime glass substrates treated with a helium ion beam.

Examples 4 and 5 show that with an ion dosage between $10^{15}$ and $10^{16}$ ions/$cm^2$ the critical load with 200 μm tip is higher than for untreated soda-lime glass.

Counterexample C1 shows that for an ion dosage of $10^{17}$ ions/cm$^2$ the critical load with 200 μm tip is lower than for untreated soda-lime glass. Therefore the scratch resistance of soda-lime glass is increased with the implantation of helium up to an ion dosage of $10^{16}$ ions/cm$^2$ at least. At higher dosages of $10^{17}$ ions/cm$^2$ the amount of implanted helium ions is too large and the scratch resistance decreases.

TABLE 5

| example | Glass type | Implanted ion | Ion acceleration voltage (kV) | Ion Dosage (ions/cm$^2$) | Critical load with 200 μm tip (N) |
|---|---|---|---|---|---|
| 4 | Soda-lime | Helium | 35 | $10^{15}$ | 17.5 |
| 5 | Soda-lime | Helium | 35 | $5 \times 10^{16}$ | 14.3 |
| C1 | Soda-lime | Helium | 35 | $10^{17}$ | 5.1 |

Table 6 shows soda-lime glass substrates treated with a nitrogen ion beam.

As can be seen when comparing the samples treated with N to those treated with Ar or He, much higher scratch resistance is obtained, often reaching the maximum load available on the microscratch tester with the 200 μm tip.

Examples 7 to 9 show that with an ion dosage between $10^{15}$ and $10^{17}$ ions/cm$^2$ at an ion acceleration voltage of 20 kV, the critical load with 200 μm tip is higher than for untreated soda-lime glass.

Examples 10 to 12 show that with an ion dosage between $5 \times 10^{15}$ and $10^{16}$ ions/cm$^2$ at an ion acceleration voltage of 35 kV, the critical load with 200 μm tip is higher than for untreated soda-lime glass.

Counterexample C2 shows that for an ion dosage of $5 \times 10^{17}$ ions/cm$^2$ at an ion acceleration voltage of 35 kV the critical load with 200 μm tip is lower than for untreated soda-lime glass. Therefore the scratch resistance of soda-lime glass is increased with the implantation of nitrogen up to an ion dosage of $10^{17}$ ions/cm$^2$. At higher dosages of $5 \times 10^{17}$ ions/cm$^2$ or more the amount of implanted nitrogen ions is too large and the scratch resistance decreases.

TABLE 6

| example | Glass type | Implanted ion | Ion acceleration voltage (kV) | Ion Dosage (ions/cm$^2$) | Critical load with 200 μm tip (N) |
|---|---|---|---|---|---|
| 7 | Soda-Lime | Nitrogen | 20 | $10^{15}$ | ≥30 |
| 8 | Soda-Lime | Nitrogen | 20 | $10^{16}$ | ≥30 |
| 9 | Soda-Lime | Nitrogen | 20 | $10^{17}$ | 16.5 |
| 10 | Soda-Lime | Nitrogen | 35 | $5 \times 10^{15}$ | ≥30 |
| 11 | Soda-Lime | Nitrogen | 35 | $10^{16}$ | ≥30 |
| 12 | Soda-Lime | Nitrogen | 35 | $10^{16}$ | 25.8 |
| C2 | Soda-Lime | Nitrogen | 35 | $5 \times 10^{17}$ | 8.6 |

Table 7 shows the scratch resistance of additional samples of soda-lime glass that were implanted with nitrogen in comparison with an untreated soda-lime glass sample (R1). In these examples and counterexamples the scratch resistance was determined using a 100 μm tip. For each group of samples implanted using an ion acceleration voltage of 15 kV (examples 13 to 16) or 25 kV (examples 17 to 20) respectively, the critical load and therefore the scratch resistance increases when the dose is increased from $5.0 \times 10^{14}$ ions/cm$^2$ to $7.5 \times 10^{16}$ ions/cm$^2$. For the group of samples implanted using an ion acceleration voltage of 35 kV the critical load increases when the ion dosage is increased from $5.0 \times 10^{14}$ ions/cm$^2$ to $7.5 \times 10^{15}$ ions/cm$^2$ (examples 21 to 23) and slightly decreases again at a dosage of $5.0 \times 10^{16}$ ions/cm$^2$ (example 24). At ion dosages above $10^{17}$ ions/cm$^2$ (examples C3, C4, C5, C6, C7) the critical load and therefore the scratch resistance decreases significantly. In these samples the critical load even drops below the critical load obtained on the untreated soda-lime glass sample R1. It can also be seen from the table below that for the same dosage, the critical load is higher when the ion acceleration voltage is higher.

| example | Glass type | Implanted ion | Ion acceleration voltage (kV) | Ion Dosage (ions/cm$^2$) | Critical load with 100 μm tip (N) |
|---|---|---|---|---|---|
| R1 | Soda-Lime | — | — | | 6.3 |
| 13 | Soda-Lime | Nitrogen | 15 | $5.0 \times 10^{14}$ | 7.1 |
| 14 | Soda-Lime | Nitrogen | 15 | $2.5 \times 10^{15}$ | 7.3 |
| 15 | Soda-Lime | Nitrogen | 15 | $7.5 \times 10^{15}$ | 7.6 |
| 16 | Soda-Lime | Nitrogen | 15 | $5.0 \times 10^{16}$ | 7.6 |
| 17 | Soda-Lime | Nitrogen | 25 | $5.0 \times 10^{14}$ | 7.3 |
| 18 | Soda-Lime | Nitrogen | 25 | $2.5 \times 10^{15}$ | 7.4 |
| 19 | Soda-Lime | Nitrogen | 25 | $7.5 \times 10^{15}$ | 7.5 |
| 20 | Soda-Lime | Nitrogen | 25 | $5.0 \times 10^{16}$ | 7.7 |
| 21 | Soda-Lime | Nitrogen | 35 | $5.0 \times 10^{14}$ | 7.5 |
| 22 | Soda-Lime | Nitrogen | 35 | $2.5 \times 10^{15}$ | 8.0 |
| 23 | Soda-Lime | Nitrogen | 35 | $7.5 \times 10^{15}$ | 8.1 |
| 24 | Soda-Lime | Nitrogen | 35 | $5.0 \times 10^{16}$ | 8.0 |
| C3 | Soda-Lime | Nitrogen | 15 | $7.5 \times 10^{17}$ | 4.6 |
| C4 | Soda-Lime | Nitrogen | 25 | $2.5 \times 10^{17}$ | 4.0 |
| C5 | Soda-Lime | Nitrogen | 25 | $7.5 \times 10^{17}$ | 4.4 |
| C6 | Soda-Lime | Nitrogen | 35 | $2.5 \times 10^{17}$ | 5.0 |
| C7 | Soda-Lime | Nitrogen | 35 | $7.5 \times 10^{17}$ | 3.6 |

As can be seen in the tables 6 and 7, nitrogen implanted soda-lime glass samples at ion dosages comprised between $5.0 \times 10^{14}$ ions/cm$^2$ and $10^{17}$ ions/cm$^2$ show increased scratch resistance compared to untreated soda-lime glass.

At ion dosages comprised between $2.5 \times 10^{15}$ ions/cm$^2$ and $10^{17}$ ions/cm$^2$ scratch resistance is particularly high, At ion dosages comprised between $2.5 \times 10^{15}$ ions/cm$^2$ and $5.0 \times 10^{16}$ ions/cm$^2$ the best scratch resistance results were obtained.

An increase of scratch resistance was observed on these examples at ion acceleration voltages comprised between 15 kV and 35 kV, but ion acceleration voltage may be increased up to 60 kV. The increase of scratch resistance was higher at ion acceleration voltages comprised between 25 kV and 35 kV than at an ion acceleration voltage of 15 kV. The scratch resistance increase was highest at ion acceleration voltages of 35 kV in these examples.

Table 8 shows the reference example R2 which is untreated aluminosilicate glass and an aluminosilicate glass substrate treated with a nitrogen ion beam.

This untreated aluminosilicate glass sample R2 has a critical load with 100 μm tip of 5.0 N.

Example 25 shows that the implantation with a dosage of $10^{16}$ ions/cm$^2$ at an acceleration voltage of 35 kV of single charge and multicharge nitrogen ions the critical load is increased. Therefore the scratch resistance of aluminosilicate glass increases with the implantation of nitrogen ions. Thus the implantation of N according to the present invention can also be applied to Aluminosilicate type glass substrates.

TABLE 8

| example | Glass type | Implanted ion | Ion acceleration voltage (kV) | Ion Dosage (ions/cm²) | Critical load with 100 μm tip (N) |
|---|---|---|---|---|---|
| 25 | Aluminosilicate | Nitrogen | 35 | $10^{16}$ | 9.2 |
| R2 | Aluminosilicate | — | — | — | 5.0 |

Table 9 shows how the amount and depth of implanted nitrogen is related to the critical load with 200 μm tip. It was surprisingly found that there is a relation between the scratch resistance as determined by the critical load on one side and the amount and depth distribution of nitrogen implanted (determined by the ratio Δ/D) on the other side.

For high Δ/D values the amount of nitrogen becomes so high or its distribution depth becomes so low that scratch resistance is lower than the maximum (see example 9).

For too high Δ/D values the amount of nitrogen is too high or its distribution depth is too low for obtaining sufficient scratch resistance (see example C2).

In a preferred range of Δ/D values of at least 4.5 μm⁻¹ and lower than 21.3 μm⁻¹ the scratch resistance of the glass substrate is increased. In a more preferred range of Δ/D values of at least 4.5 μm⁻¹ and lower than 15.4 μm⁻¹ the scratch resistance of the glass substrate is increased further.

TABLE 9

| example | Critical load with 200 μm tip (N) | Implantation depth D (μm) | Nitrogen quantities implanted Δ | N ion concentration Δ/D (μm⁻¹) |
|---|---|---|---|---|
| 7 | ≥30 | 0.15 | 0.67 | 4.5 |
| 8 | ≥30 | 0.35 | 2.10 | 6.0 |
| 9 | 16.5 | 0.35 | 5.40 | 15.4 |
| 10 | ≥30 | 0.40 | 2.00 | 5.0 |
| 11 | ≥30 | 0.35 | 2.71 | 7.7 |
| 12 | 25.8 | 0.35 | 2.91 | 8.3 |
| C2 | 8.6 | 0.55 | 12.0 | 21.3 |

The invention claimed is:

1. A process for increasing the scratch resistance of a glass substrate, the process comprising:
   maintaining the temperature of the area of the glass substrate being treated at a temperature that is less than or equal to the glass transition temperature of the glass substrate,
   setting the acceleration voltage for the extraction of nitrogen simple charge or multicharge ions at a value comprised between 25 kV and 60 kV,
   setting an ion dosage at a value comprised between $10^{14}$ ions/cm² and $10^{17}$ ions/cm², and
   implanting, within the glass, the nitrogen simple charge and multicharge ions.

2. A process according to claim 1, wherein the acceleration voltage is set at a value comprised between 25 kV and 35 kV.

3. A process according to claim 2, wherein the ion dosage is set at a value comprised between $5.0 \times 10^{14}$ ions/cm² and $10^{17}$ ions/cm².

4. A process according to claim 1, wherein the glass substrate is selected among soda-lime glass and aluminosilicate glass.

5. A process according to claim 2, wherein the ion dosage is set at a value comprised between $2.5 \times 10^{14}$ ions/cm² and $10^{17}$ ions/cm².

6. A process according to claim 2, wherein the ion dosage is set at a value comprised between $2.5 \times 10^{15}$ ions/cm² and $5 \times 10^{16}$ ions/cm².

* * * * *